United States Patent [19]
Kroger et al.

[11] 3,979,613
[45] Sept. 7, 1976

[54] MULTI-TERMINAL CONTROLLED-INVERSION SEMICONDUCTOR DEVICES

[75] Inventors: Harry Kroger, Sudbury; Horst A. R. Wegener, Carlisle, both of Mass.

[73] Assignee: Sperry Rand Corporation, New York, N.Y.

[22] Filed: June 18, 1975

[21] Appl. No.: 587,939

[52] U.S. Cl. .............................. 307/304; 357/23; 357/52
[51] Int. Cl.² ........................................ H03K 3/353
[58] Field of Search .................... 357/23, 52, 57; 307/304

[56] References Cited
UNITED STATES PATENTS

| | | |
|---|---|---|
| 3,829,886 | 8/1974 | Kroger .............................. 357/28 |
| 3,831,185 | 8/1974 | Kroger .............................. 357/6 |
| 3,877,058 | 4/1975 | Cricchi ............................. 357/24 |

Primary Examiner—Martin H. Edlow
Attorney, Agent, or Firm—Howard P. Terry

[57] ABSTRACT

Multi-terminal controlled-inversion semiconductor devices are presented having current or voltage controllable switching characteristics provided through use of a non-linear resistive layer and by the control of the rate of injection of carriers with respect to their rate of removal by conduction through the non-linear layer.

24 Claims, 19 Drawing Figures

MULTI-TERMINAL CONTROLLED-INVERSION SEMICONDUCTOR DEVICES

BACKGROUND OF THE INVENTION

1. Field of the Invention

The invention generally relates to the field of stable semiconductor devices and circuits and is more particularly concerned with multi-terminal semiconductor structures having an abruptly switched transition in current-carrying capacity at predetermined threshold conditions.

2. Description of the Prior Art

Controlled inversion bistable diode devices, which may take the form of two-terminal metal, non-linear resistor, semiconductor devices are known in the prior art, as will be further discussed. They have the capacity of being reliably and repeatably switched between two well-spaced impedance states, these semiconductor devices having an abruptly switchable transition in current carrying capacity at a temperature-stable threshold voltage. Use is made of the non-linear characteristics of a dielectric or resistive layer within the semiconductor device in a configuration that reliably balances the rate of injection of charges with respect to their rate of removal through the non-linear resistive layer over a wide range of temperatures. Relatively high currents may be rapidly switched, and in one form of the diode reliable switching may be repeatedly obtained at predetermined threshold values substantially independent of temperature.

SUMMARY OF THE INVENTION

The present invention relates to multiple-terminal controlled-inversion semiconductor devices provided with current or voltage controllable switching characteristics through the use of a non-linear resistive layer for controlling the rate of injection of carriers with respect to their rate of removal by conduction flow through the non-linear layer when in its low resistance state. The threshold at which abrupt switching of the impedance state obtains is raised or lowered according to the magnitude and sense of the voltage applied across the semiconductor junction interface, a mechanism affording a variety of novel applications for the controlled inversion devices. Coincidence or non-coincidence of base and collector pulse inputs is signalled by the yielding of an amplified output current pulse for the coincidence event. Latching or memory writing functions may thus be performed, as well as switching and amplifying functions. These may be in response to electrical or optical inputs.

DESCRIPTION OF THE PREFERRED EMBODIMENTS

Controlled inversion bistable devices, which are metal, non-linear resistance, semiconductor junction devices or, alternatively, are metal, non-linear resistance, semiconductor barrier-emitter devices, both of which types may be switched between two or more relatively stable impedance states, have been presented in the H. Kroger, H. A. R. Wegener U.S. Pat. application Ser. No. 354,271, filed Apr. 25, 1973 for a "Controlled Inversion Bistable Switching Diode", assigned to Sperry Rand Corporation and issued as U.S. Pat. No. 3,831,185 on Aug. 20, 1974. Such devices employing metal barrier-emitters are disclosed in the Harry Kroger U.S. Pat. application Ser. No. 354,279 for a "Controlled Inversion Bistable Switching Diode Device Employing Barrier Emitters", also filed Apr. 25, 1973 and assigned to Sperry Rand Corporation. The latter application issued Aug. 20, 1974 as U.S. Pat. No. 3,831,186.

Figure 1:
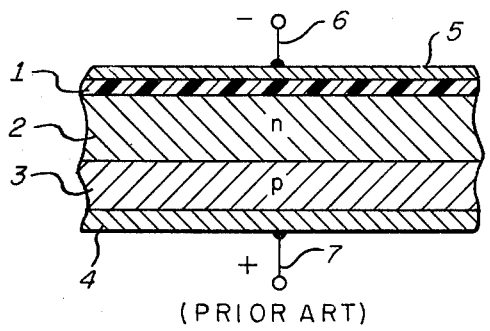
FIGS. 1 and 2 are elevation cross section views of alternative forms of prior art devices.
Figure 2:
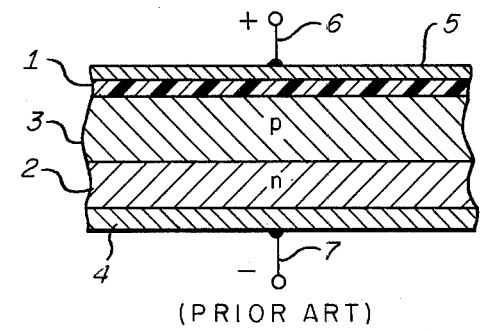

FIGS. 1 and 2 are representative of the prior art devices of the aforementioned Pat. applications Ser. No. 354,271, and represent devices that employ a special non-linear resistance characteristic of a dielectric layer in a semiconductor diode configuration for abrupt current switching purposes. Referring to FIGS. 1 and 2, which figures each represent sections of alternative forms of the prior art semiconductor diode, layer 1 is formed of the special non-linear resistive material and is placed upon a semiconductor body including the respective type n and type p conductivity layers 2 and 3. The non-linear resistive layer 1 is in both cases covered with a conductive metal layer 5 which may be molybdenum or chromium coated with a thin protective layer of gold to which an ohmic lead 6 is attached. Opposite the non-linear resistive layer 1, there may be formed on the semiconductor body comprising layers 2 and 3 a second conductive metal layer 4 to which an ohmic lead 7 is attached. Layer 4 may again be a molybdenum or chromium layer coated with a thin protective layer of gold also useful in the thermocompression bonding of lead 7. The respective type n and type p or p+ layers 2 and 3 in FIG. 2 are reversed in position with respect to their positions in FIG. 1, and the bias voltages applied to the respective terminals 6 and 7 are accordingly reversed in FIG. 2. The substrate layer 3 in FIG. 1 may be, for example, a type p or p+ semiconductor layer with the type n layer 2 epitaxially grown upon it in a conventional manner.

Referring particularly to the form of the bistable diode illustrated in FIG. 1, a typical construction may be described as using silicon for the materials of layers 2 and 3 doped in a conventional manner and having respective thicknesses of approximately 2 and 15 microns. The non-linear resistive layer 1 will preferably be a silicon nitride of silicon oxynitride or siliconrich silicon nitride layer 20 to 200 Angstroms thick and may be covered with a layer of evaporated molybdenum about $2 \times 10^{-5}$ to $2 \times 10^{-6}$ centimeters thick. The ohmic layer 4 at the base of the semiconductor layer 3 may be formed in the usual manner of a layer of evaporated chromium about $2 \times 10^{-6}$ centimeters thick. Representative areas of each of the layer interfaces are $5 \times 10^{-4}$ square centimeters, though devices with smaller or larger areas may readily be made.

Materials which display the suitable non-linear resistive properties desired for layer 1 may include insulative materials such as silicon nitride, silicon oxynitride, silicon-rich silicon nitride, or silicon-rich silicon oxynitride, or mixtures thereof, materials which will herein be generally classified as nitrides of silicon. In general, controlled methods for the formation of desirable layers of such non-linear resistive materials are similar to those established in the art; for example, production of a silicon nitride layer on a semiconductor substrate is taught generally in the U.S. Pat. No. 3,573,096, issued Mar. 30, 1971 to N. C. Tombs, for a "Silane Method of Making Silicon Nitride", assigned to Sperry Rand Corporation. Also of general interest are the N. C. Tombs U.S. Pat. No. 3,422,321, issued Jan. 14, 1969 for "Oxygenated Silicon Nitride Semiconductor Device and Silane Method of Making Same", and the R. I. Frank and W. L. Moberg U.S. Pat. No. 3,629,088, issued Dec. 21, 1971 for a "Sputtering Method for Deposit of Silicon Oxynitride", both patents being assigned to Sperry Rand Corporation.

When voltage-biased in the respective senses indicated in FIGS. 1 and 2, both diode structures demonstrate the desirable abrupt switching characteristics discussed in further detail in the aforementioned Pat. application Ser. No. 354,271. The devices, when initially placed in the zero bias voltage state, will follow a substantially constant current curve as the bias voltage is increased until that voltage reaches a maximum or threshold voltage $V_{th}$. If an attempt is made to increase the bias voltage above the value $V_{th}$, the abrupt switching mechanism operates, manifesting itself as a very rapid transition from a high to a low impedance state. It is found experimentally that the largely resistive impedance of the non-linear layer 1 and therefore of the diode can change in less than 5 nanoseconds between the two states by a factor as great as $10^5$ to $10^7$. For instance, in the aformentioned example of a device having a metal layer 5 with an area of $5 \times 10^{-4}$ square centimeters, the metal layer 5 being evaporated on an oxynitride layer 1 of $2 \times 10^{-7}$ centimeters thickness residing, in turn, on a silicon p-n body 2, 3, the high impedance state of the diode presented a resistance of greater than $10^6$ ohms, while its low impedance state had a resistance of less than 50 ohms. It will be seen that a feature dominating the operating characteristics of the bistable diode lies in the nature of the conducting mechanism within insulative layer 1. The device of FIG. 1 is again shown, for example, in FIG. 3 where it will be further discussed in relation to the graphs of FIGS. 4, 5, and 6, which graphs plot amplitude of the electrical field along the device under three differing circumstances.

Figure 4:
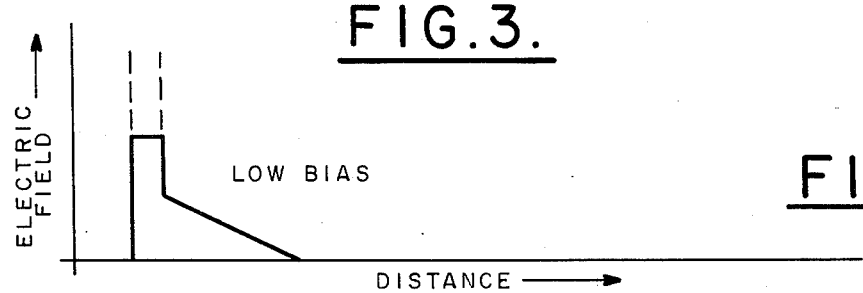
FIGS. 4, 5 and 6 are graphs useful in explaining how electric fields are distributed in the embodiments of the invention.
Figure 5:
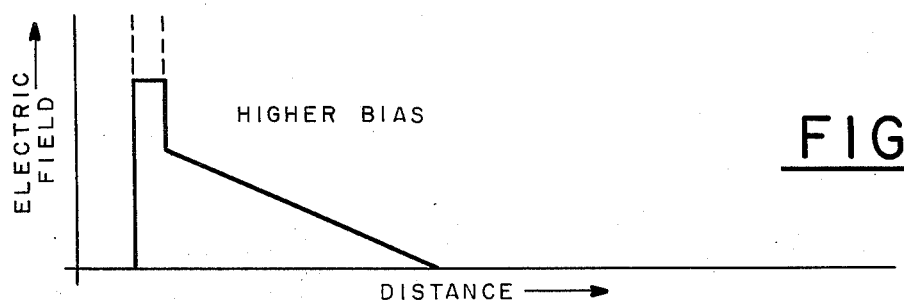

Starting with the zero bias-voltage situation, the high impedance state of the diode is characterized in FIGS. 4 and 5 by a widening depletion zone 15 within the type n layer 3 adjacent non-linear resistive layer 1. As the field is increased from the FIG. 4 to the FIG. 5 situation, the depletion layer 15 extends to a distance $W_1$ from non-linear layer 1. When the bias voltage almost reaches the threshold voltage value $V_{th}$, the depletion layer 15 has a steady state width $W_1$ much greater than it could have if the non-linear resistive layer 1 were a pure insulator; evidently, an inversion layer would of necessity form at the surface of semiconductor layer 3 common with layer 1 if that insulative layer did not conduct at all. For the device of the aforementioned example, and if the non-linear layer 1 were a pure insulator, a steady state width for the depletion layer 15 of about 1 micron could exist for a doping level of $6 \times 10^{14}$ per cubic centimeter with a material such as phosphorus or arsenic used as a dopant in the type n silicon layer before such a strong inversion would occur. The inversion event would limit further extension of the depletion layer 15 if the material of layer 1 was a pure insulator. In addition, inversion layer formation would cause almost all of the total voltage drop to appear across the non-linear layer 1; with the typical layer thickness of $2 \times 10^{-7}$ centimeters, as bias voltage even as low as 50 volts would irreversibly damage the insulative layer 1 under such operating conditions.

Figure 3:
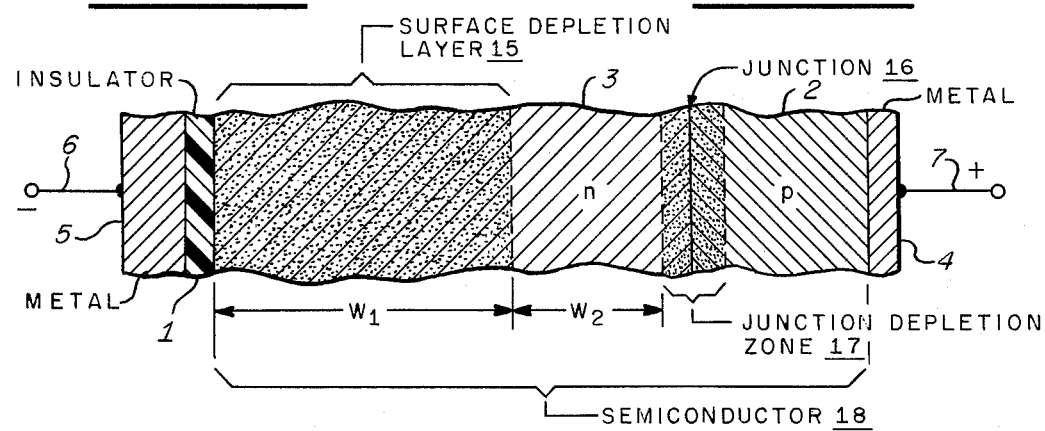
FIG. 3 is a drawing similar to FIG. 1 additionally showing depletion layers and other factors of interest in explaining operation of the devices.

In the diodes of FIGS. 1 and 2, the depletion layer 15 of FIG. 3 is allowed to increase in extent in the high impedance state of the device, permitting the existence of a high value of the threshold voltage $V_{th}$, and such is accomplished because an inversion layer is not permitted to form. In its high impedance state, the only possible mechanism for preventing the formation of the undesired inversion layer is actual controlled conduction of electrons through the non-linear resistive layer 1. Conduction through the non-linear resistive layer 1 in the high impedance state is in sufficient quantity to remove the carriers that would form an inversion layer at the interface between non-linear layer 1 and semiconductor layer 3. The exact mechanism of operation may differ at least in detail, and the discussion of it herein is not intended to be interpreted in a limiting sense.

Figure 6:
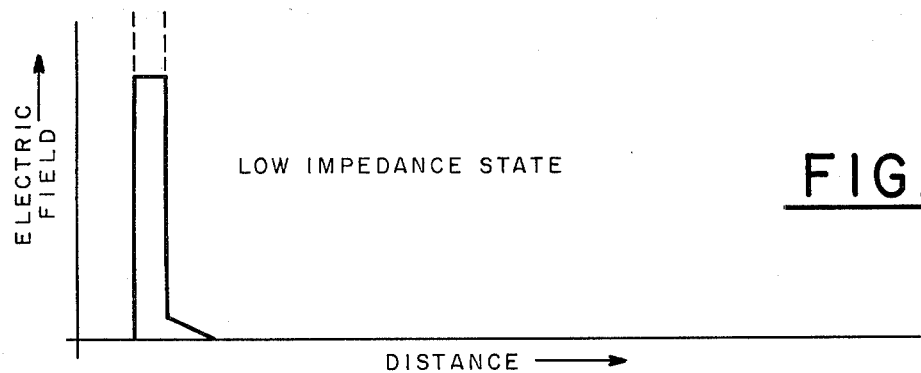

At all times, except during the actual instant of transition between high and low impedance states, the diode device is in a state of dynamic equilibrium expressed by the requirement of steady-state current continuity. If the bias voltage applied at terminals 6, 7 is increased to a value with respect to $V_{th}$ which prohibits current continuity, then switching must occur to achieve a new internal state of the electric field distribution, as seen in FIG. 6, a state in which current continuity throughout the device again prevails. The conduction of the non-linear layer 1 is greatly increased in the low impedance state, not only because of the higher electric field associated with the inversion, but also because of the highly non-linear conductivity nature of non-linear layer 1, as will be discussed.

The new steady state low-impedance condition is characterized by a greatly increased voltage drop across layer 1, a requirement that can be realized only if an inversion layer is actually formed at the layer 1 by the increased rate of arrival of minority carriers injected by the junction 16 of FIG. 3. The low-impedance state is thus marked by a relatively low voltage across the device, even though the electric field across the non-linear layer 1 is high. The new equilibrium is achieved only when the electric field across the non-linear layer 1 is great enough that minority carriers are moved rapidly from the junction depletion region 17 through layer 1 as fast as the junction 16 may supply them. The electric field shown in FIG. 6 across layer 1 may be as high as $10^7$ volts per centimeter, so that the dielectric strength of the layer 1 is selected to be as high as possible to prevent catastrophic break down therethrough.

It is seen that the conductance of the diode device is controlled by the semiconductor's surface depletion zone 15. In the high impedance state, the device has a large depletion layer width with no inversion layer formation until the bias is nearly equal to the threshold value $V_{th}$. The normal tendency to form an inversion layer is thwarted by a small but finite current conducted through the non-linear layer 1. In the low impedance state, on the other hand, the semiconductor surface is strongly inverted with a collapsed depletion zone. It will also be understood that the value of $V_{th}$ may be increased by increasing the total thickness of the semiconductor epitaxial layer 3 if doping density is held constant, and vice versa, an increase in dopant density providing an increased threshold voltage. It will also be understood that if the ratio of current in the low impedance state to the current in the high impedance state is to be high for a given dielectric strength of the non-linear layer 1, the material thereof must demonstrate highly non-linear characteristics with greatest conductance occurring at high fields.

The threshold voltage $V_{th}$ is always less than that voltage required completely to deplete the type $n$ region 3, which is the punch-through voltage. Variation of the voltage across the surface depletion zone affects not only the conductance of the non-linear layer 1, but also the rate of hole injection from the $p$-$n$ or $p$+-$n$ junction into the epitaxial type $n$ layer 3, even though punch-through does not occur. Higher applied biases reduce the width of the neutral (undepleted) type $n$ layer 3 between the junction 16 and surface depletion zone 15. Physically, the threshold voltage $V_{th}$ is attained when the current supplied by the junction 16 is so great that the current through the non-linear layer 1 can not keep pace with it. Thus, current continuity can not be maintained in the latter situation across the entire device without an internal rearrangement of the field distribution.

A further important feature of the bistable diode device lies in the fact that relative temperature stability of the switching threshold voltage $V_{th}$ may be achieved by the use of certain compensatory effects which involve the internal dynamic equilibrium existing between the arrival and removal of charge carriers at the insulator-semiconductor interface (the interface between layers 1 and 3) for a device biased just below the threshold $V_{th}$ at a given temperature. At such a bias condition for some device types, the conductance of non-linear layer 1 is just sufficient to remove the minority carriers from this interface at the same rate as they arrive without the formation of the inversion region within semiconductor layer 3 at layer 1. Now, if the temperature is raised by a small increment, it is found that the rate of arrival of minority carriers injected by junction 16 increases more rapidly than the rate of removal by conduction through non-linear layer 1 and an inversion layer must form, causing the device rapidly to switch to its low impedance state. A specially compensated diode device is so arranged that the rate of arrival of minority carriers injected by junction 16 remains substantially the same over a relatively wide temperature range as their rate of removal by conduction through non-linear layer 1. In order to achieve the demonstrated temperature stability, tunneling is therefore not used as a conduction mechanism in the present invention.

Thus, relatively temperature-stable switching operation is achieved by the use of a material for non-linear layer 1 which has a temperature dependance matching that of the semiconductor. Conventional Frankl-Poole or conventional Schottky emission, for example, generally result in a better match over a range of temperatures to the injection current of the semiconductor $p$-$n$ junction 16 and therefore provide a desirable reduction in temperature sensitivity of the threshold voltage $V_{th}$.

The conductance of the non-linear layer 1, by the proper choice of a material such as silicon nitride or silicon oxynitride, is made to depend non-linearly upon the electric field strength across layer 1 to the extent that, when an inversion layer is formed in semiconductor layer 3, the non-linear layer 1 can pass large current densities at electric fields that are far enough below its electrical breakdown strength that the layer is not damaged. A vapor deposited high resistance silicon nitride layer 1 rather than a thermally grown silica layer offers significantly improved thermal stability of the threshold voltage $V_{th}$ because of the desired greater density of traps introduced by vapor deposition. Such traps result in a predominantly field assisted thermalemission conductivity, for example, whose temperature dependence closely matches the temperature characteristic of the forward biased junction, resulting in a threshold voltage $V_{th}$ substantially independent of temperature.

Figure 7:
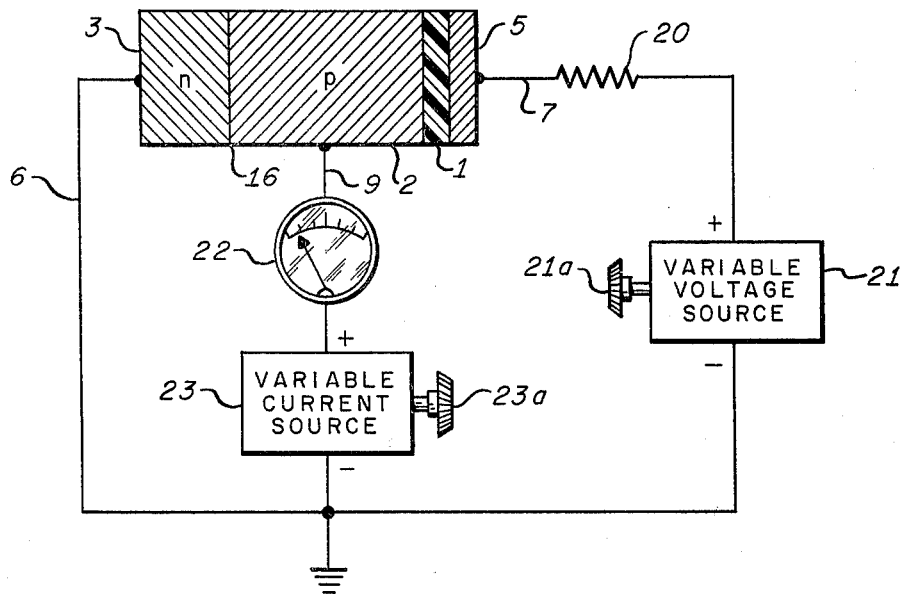
FIG. 7 illustrates a circuit making use of the novel controlled inversion device.

The characteristics of suitable silicon oxynitride and other non-linear materials and preferred methods of fabricating layers of them for use in the present inventions are substantially those discussed in the aforementioned patent application Ser. No. 354,271, wherein there also appear detailed discussions of ways of making the bistable diode devices of FIGS. 1, 2, and 3. It will now be seen that the existence of the inversion layer in the diode structure and, hence, the transition to the low impedance state, may be controlled according to the present invention by external regulation of the supply of minority carriers. As in FIG. 7, a three-terminal device may be formed for this purpose with the third terminal 9 made by an ohmic contact attached to the type $p$ conductivity base layer 2 between the non-linear resistivity layer 1 and the junction interface 16 of the emitter layer 3 and base layer 2. The base terminal 9 forms an important means for controlling the supply of carriers reaching the surface depletion zone adjacent the non-linear resistive layer 1. A forward bias voltage may be applied across the junction interface 16 between semiconductor layers 2 and 3 independent of the voltage on collector layer 5, thus controlling the density of minority carriers in the base layer 2 region and lowering the threshold voltage of collector 5. Alternatively, a reverse bias voltage applied across the same junction 16 tends to sweep the minority carriers away from the base region 2 and the threshold voltage of collector layer 5 is raised. For such representative kinds of operation, an emitter-to-collector voltage may be supplied from variable current source 23 across the controlled inversion semiconductor device of FIG. 7 and the current through the utilization device represented by load resistor 20 may be controlled by the variable bias source 21 connected between ground and electrode 9 of the base layer 2. It is seen that the structure of FIG. 7 is very easily made using the general techniques of the aforementioned U.S. Pat. No. 3,831,185, for example. Grounded base or grounded emitter circuits may be used.

Figure 8:
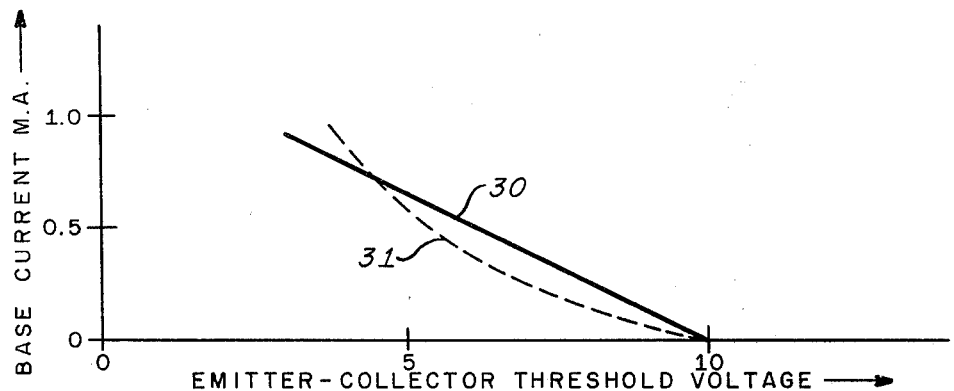
FIGS. 8, 9, and 10 are graphs useful in explaining the operation of the circuit of FIG. 7.
Figure 9:
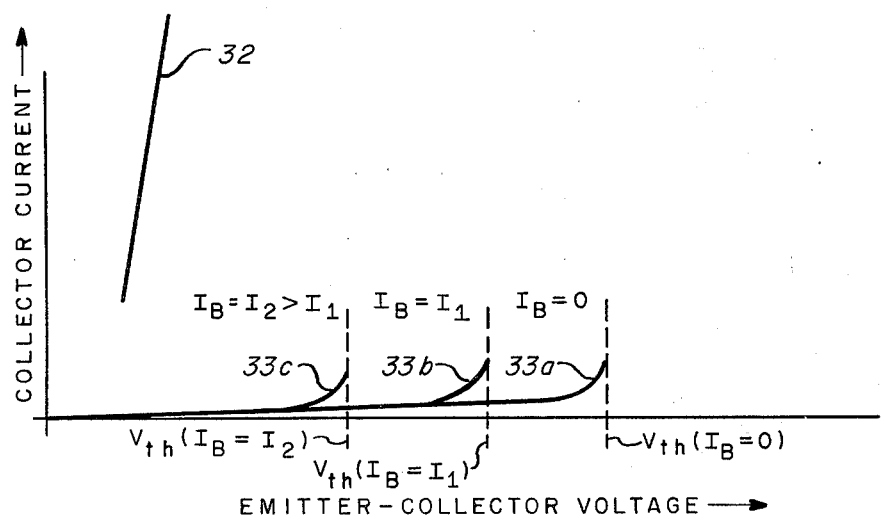

In the circuit of FIG. 7, the type of biasing is used in which the $n$-$p$ junction of the $n$-$p$-non-linear resistor-metal structure is forwardly biased; this is a common or grounded emitter connection in which all voltages are measured with respect to the grounded emitter terminal 6. The behavior of the device of FIG. 7 may be examined under such common emitter connections with respect to the circuit illustrated in FIG. 7 and it will be seen that the threshold collector voltage $V_{th}$ is a function of the bias current, the base current tending to enhance the transition of the device from its high to its low temperature state. When electrical current from a conventional variable current source 23, adjustable according to the setting of control 23a and poled as shown in the drawing, flows into the type $p$ base electrode 2, the threshold voltage $V_{th}$ for the controlled inversion semiconductor device is altered. The effect is illustrated in one manner in FIG. 8, wherein the base current for a representative experimental controlled inversion device is plotted against the emitter-collector voltage provided by a conventional variable voltage source 21, whose output is adjusted according to the setting of control 21a. The base current may be measured by a meter 22 placed in series with ohmic contact 9 and current source 23. In FIG. 9, a typical way of presenting the characteristics of the FIG. 7 controlled inversion device and circuit is represented, wherein collector current (the current in lead 7) is plotted with respect to the emitter-collector voltage provided by source 21. Curve 33a of FIG. 9 represents the characteristic of a controlled-inversion device at zero base current, this characteristic being clearly the same as that of the devices described in the aforementioned U.S. Pat. No. 3,831,185. When a base current $I_B = I_1$ is made to flow, curve 33b is obtained and with it a lower value of the threshold voltage $V_{th}$. When $I_B$ is increased to $I_2$, for example, such that $I_2 > I_1$, then curve 33c obtained, with an even lower value of voltage $V_{th}$. In FIG. 8, a second way of presenting the characteristic of the three-terminal controlled inversion device of the present invention is demonstrated, wherein the base current $I_B$ is plotted directly against the emitter-collector threshold voltage $V_{th}$. The values for this curve are readily obtained from FIG. 9. Both curves 30 and 31 of FIG. 8 show the approximately linear relationship between base current $I_B$ and the reduction in threshold voltage $V_{th}$.

The unexpected advantage of the semiconductor controlled inversion device of FIG. 7 is that the onset of large current gain is readily controlled according to the magnitude of the base current flowing in contact 9. A relatively small change in a relatively small current in lead 9 supplied to base 2 can turn on the flow of a relatively large current in the emitter-collector circuit and through load 20. For example, emitter-collector currents of 100 to 250 milliamperes are reliably controlled with base currents of only milliampere, so that current gains of 100 are readily achieved. Gains of 2000 and higher have been observed and there is no reason to believe that such gains cannot be achieved with reliable regularity.

Figure 10:
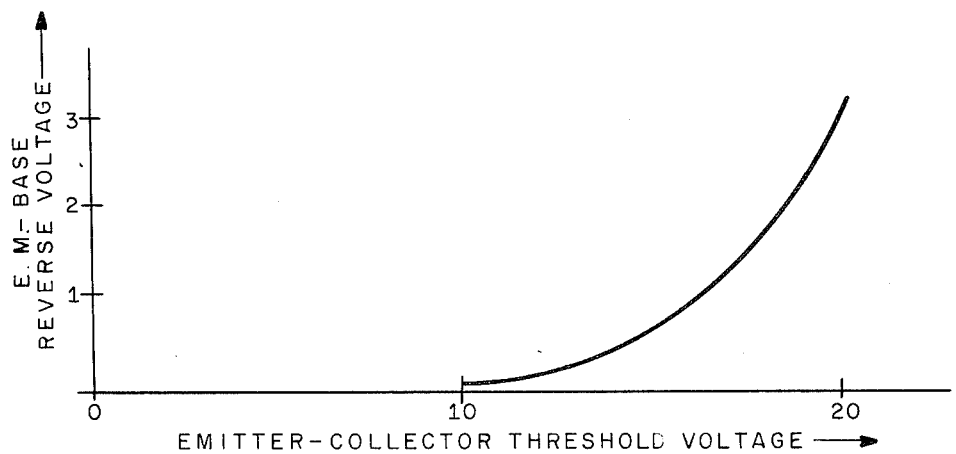

The controlled inversion invention of FIG. 7 is also useful in the n-p-non-linear resistor-collector form in a common emitter circuit with the polarity of the current source 23 reversed; in this arrangement, the base current inhibits the tendency of transition of the controlled inversion device to its low impedance state. Thus, a forward bias is applied to the junction 16 between semiconductor layers 2, 3 in the one instance, while reverse biasing is used in the second. For the reversed bias condition, FIG. 10 illustrates a plot of the change in the emitter-collector threshold voltage as a function of the emitter-base reverse bias voltage. This plot is related to that of FIG. 8, the major difference being that a reverse bias has been applied between contacts 7 and 9, rather than a forward bias as in FIG. 8.

The mechanism of operation of the novel controlled inversion device builds upon the operation of the prior bistable or polystable diode devices of FIGS. 1 and 2. For example, upon application of a forward bias to the junction between layers 2 and 3 (FIG. 7), the density of minority carriers in the base region 2 increases, thus making the generation of an inversion layer at the non-linear resistor layer face more highly probable. If, on the other hand, a reverse bias voltage is applied to the junction 16 between layers 2 and 3, the concentration of minority carriers in base 2 is at once reduced, thus making formation of an inversion layer at the interface between semiconductor layer 2 and the non-linear resistive layer 1 difficult.

Operation of the invention will be further illustrated by considering certain applications of the invention which will now be described. For example, to form a logic circuit, the continuous unidirectional voltage sources 21, 23 of FIG. 7 may both be replaced by pulsed signal sources, or one pulsed signal source may be used with one continuous unidirectional signal source. For example, assume in FIG. 7 that source 23 is a source of variable amplitude unidirectional current pulses; also assume that source 21 is a source of variable amplitude unidirectional voltage pulses. It is further assumed that the forward biased form of the FIG. 7 circuit is employed. Under such circumstances, current pulser 23 supplies on contact 9 a pulse of base current of magnitude $i_p$, while the voltage pulser 21 supplies a pulse of collector-emitter voltage of magnitude $V_p$. If $i_p$ is chosen, for example, to equal $I_1$ as defined with respect to FIG. 9, and if $V_p$ is chosen to lie within the interval $V_{th}(I_B = I_1) < V_p < V_{th}(I_B = 0)$ as also illustrated in FIG. 9 then:

a. a transition of the controlled inversion device from its high to its low impedance state will occur if a base current and a collector voltage pulse substantially overlap in time, a highly amplified current pulse appearing in load 20 in this circumstance, b. no transition to the low impedance state can occur if the two input pulses do not overlap at all in time, so that no significantly amplified current pulse then reaches load 20, c. assuming that there is partial overlap of the two pulses, the low impedance state is found to be retained by the controlled inversion device as long as the collector voltage pulse is present if its voltage level $V_p$ is greater than an empirically observed value, even after the base current pulse has ended, the value under a representative circumstance being of the order of 80 percent of $V_{th}$ for $I_B = 0$, d. assuming again that there is partial overlap of the two input pulses, the low impedance state is found to be retained by the controlled inversion device only as long as both of the two input pulses are present if $V_p$ is less than the predetermined value of situation (c).

In situation, (c), the circuit of FIG. 7 then becomes a latching circuit for latching in the low impedance state and being capable of performing a storage or memory writing function. The duration of storage is determined by the length of the collector voltage pulse. The effect of latching to a low impedance state is to serve as a memory of the fact that the duration of the base current pulse when of predetermined amplitude overlapped in time the occurrence of a collector voltage pulse of predetermined magnitude to cause transition to the low impedance state. The actual existence of the low impedance state may be read by observing the current flowing through lead 7 of the FIG. 7 device, or the voltage level at contact 5 of FIG. 7. Further, the state may be read by measuring either the real or the imaginary part of the differential impedance levels between terminals 3 and 7 or between 7 and 9 if the device is in its low d.c. impedance state. Radio frequency impedance will also be low. Low values of load 20 and high values of the collector voltage tend to make latching most probable. In situation (d), a switching function is performed; the device of FIG. 7 then conducts significantly through collector terminal 7 only when the base current pulse is present. With $V_p$ above the aforementioned empirically determined level, the device operates for a predetermined time continuously to supply minority carriers of the base at such a level that an inversion layer is maintained, thus permitting continuing flow of amplified current through load 20. On the other hand, with $V_p$ below the aforementioned predetermined level, flow of amplified current stops at the end of the input pulses because the minority carriers originally forming the inversion layer are swept away across the non-linear resistor faster than they can be re-supplied by the junction and thus the device reverts to its high impedance state.

Figure 11:
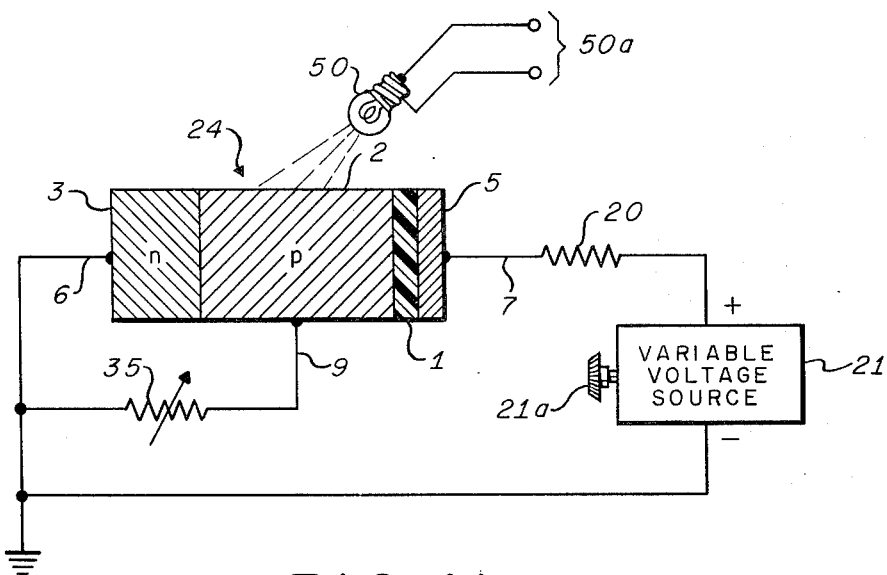
FIGS. 11 and 12 illustrate additional circuits making application of the bistable non-linear controlled inversion device of FIG. 7.

Further applications of the novel controlled inversion device appear in the circuit of FIG. 11; FIG. 11 illustrates a circuit similar to that of FIG. 7, so that similar reference numerals are employed when appropriate. The variable current source 23 of FIG. 7 is replaced by a manually or otherwise variable impedance $R_V$, illustrated by way of example as a variable resistor 35 coupled between one terminal of variable voltage source 21 and the device base contact 9. Source 21 may be a source of continuous unidirectional voltage or of voltage pulses, as previously explained. In the latter instance, the emitter-collector voltage pulses and the base current pulses are evidently automatically synchronous. The variable element 35 may be a conventional variable resistor or a field-effect transistor whose source-to-drain impedance can be electronically controlled by a gate electrode in a conventional manner. Again, pulses or continuous input signals may be employed.

Figure 12:
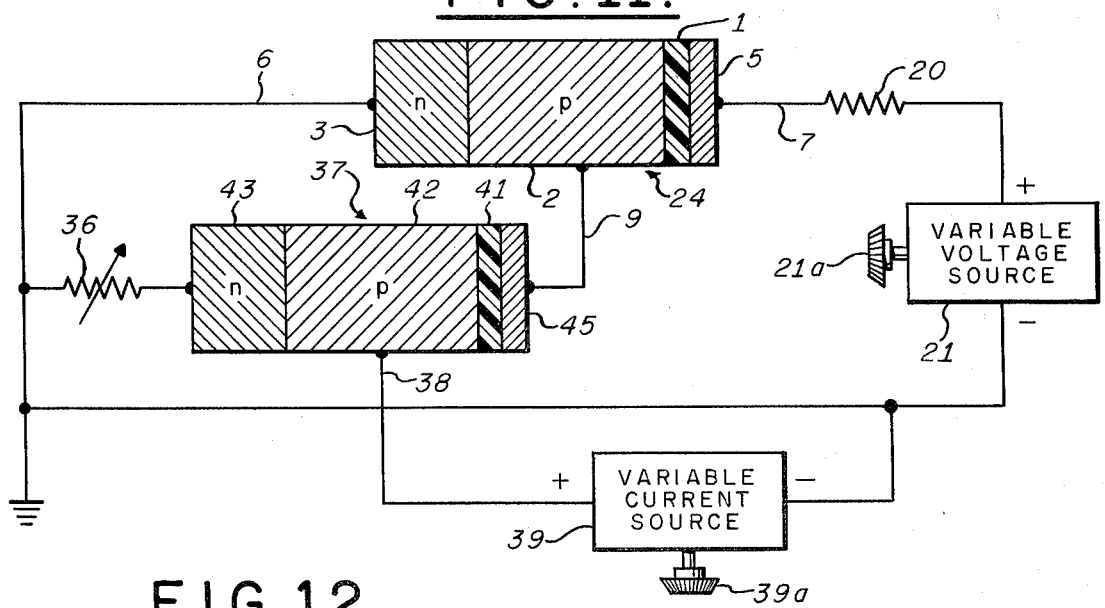
Figure 13:
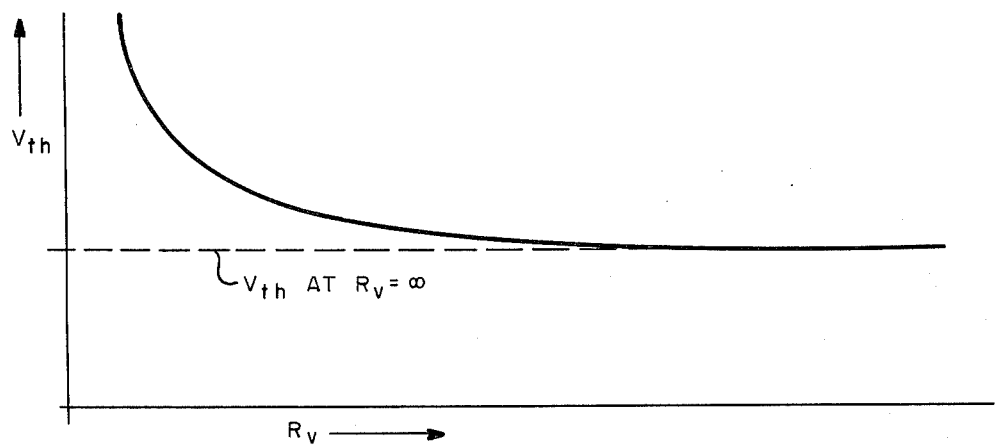
FIG. 13 is useful in explaining the operation of the circuits of FIGS. 11 and 12.

In place of the variable impedance 35 of FIG. 11, the arrangement of FIG. 12 may be employed; where applicable, reference numerals similar to those of FIGS. 7 and 11 are used in FIG. 12. The variable resistor 35 of FIG. 11 is replaced in FIG. 12 by a resistor 36, which may be adjustable, and by a second controlled inversion device 37 of the present novel kind, resistor 36 being coupled to the emitter layer 43 of device 37 and base contact 9 of device 24 being connected to the collector 45 of device 37. The controlled inversion device 37 is controlled by having a variable current source 39 coupled to its contact 38 to the base layer 42 between emitter 43 and the non-linear resistive layer 41. As before, the sources 21 and 39 may be sources of continuous or pulsed energy. It is apparent that controlled inversion device 37 may normally reside in either of its two extreme states. Controlled inversion device 37 may be a smaller area device, since it would normally be desired to use the original device 24 to amplify the pulse current swing of the controlled inversion device 37.

With respect to the operation of the embodiments of FIGS. 7, 11, and 12, FIG. 13 shows the effect of a change of the variable impedance $R_V$ of element 35, for example, with respect to the device threshold voltage $V_{th}$; when $R_V$ approaches zero, $V_{th}$ approaches infinity. As $R_V$ approaches infinity, $V_{th}$ approaches a value which would be observed if the impedance 35 were not present at all. The control circuit of FIG. 11 therefore permits regulation of the threshold voltage $V_{th}$ to high values. In the FIG. 12 embodiment, $V_{th}$ for the controlled device is substantially that for $R_V = \infty$ in the high impedance state of the controlling device 37. Also, $V_{th}$ for the controlled device 24 is that for $R_V = \infty$ when the controlling device is in its low impedance state. It is apparent that the configuration of FIG. 12 acts essentially as an inverter and pulse amplifier. If the controlling device 37 is conducting, it is possible to find a voltage $V_1 > V_{th}$ ($R_V = \infty$) such that the controlled device 24 is not conducting or is in its high impedance state. On the other hand, if the controlling device 37 is not conducting, the controlled inversion device 24 can not be conducting, being in its high impedance state so long as voltage 21 is less than $V_{th}$ ($I_B = 0$) for device 24.

Accordingly, it is seen that the state of conduction of the novel controlled inversion device of the present invention may be controlled in several ways, so that it represents a device of considerable versatility. By way of further example, a light source 50 powered at terminals 50a may be used instead of the kinds of control circuits discussed in connection with FIGS. 7, 11, and 12 for the same control pulses. In this optically actuated switch, the light and the device control-voltage may again be continuous or pulsed. In the optical switch, use may be made, for example, of the simultaneous presence of both base current drive and optical energy to initiate transition to the low impedance state. The threshold level and sensitivity of the optically controlled device may be adjusted preferably by the use of a relatively low continuous base current, though raising the collector voltage may also be employed. The presence of a particular light level is readily detected by use of a repeatedly amplitude scanned resistor 35 in FIG. 11, scanning occurring over an appropriate range of resistance values. By arbitrarily fixing the value of resistor 35, the advent of a particular light level may be detected by inversion of state, lower light levels being detected with greater base currents.

Figure 14:
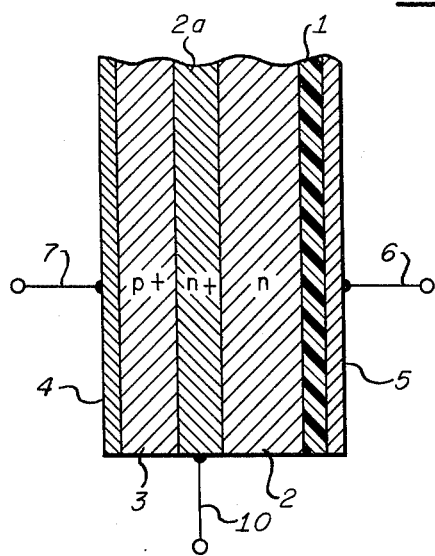
FIGS. 14 through 19 are elevation cross section views illustrating further alternative forms of the controlled inversion device of FIG. 1.
Figure 15:
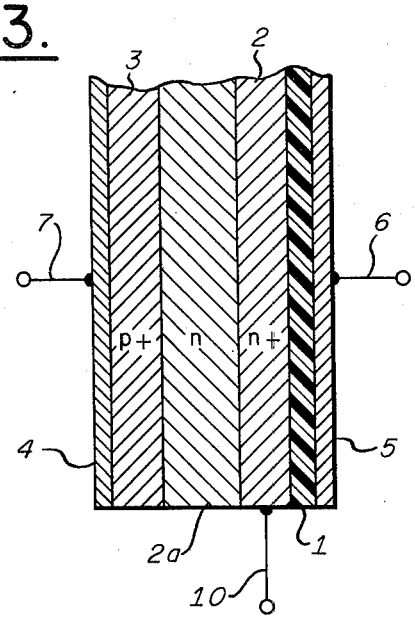
Figure 16:
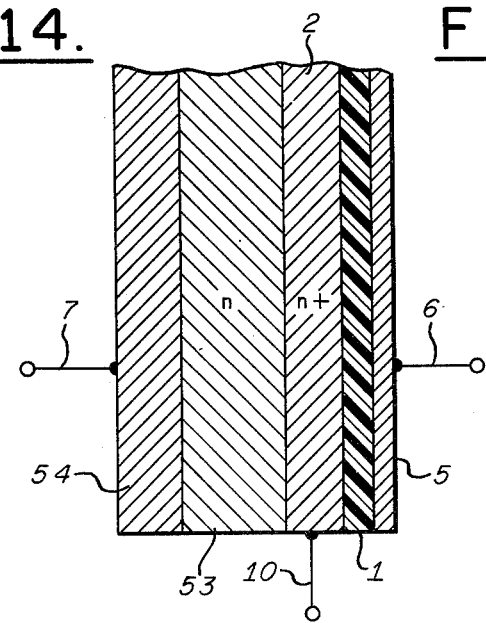

The novel controlled inversion device is not restricted to the particular configuration used by way of illustration in FIG. 7, but may take on forms such as those illustrated in FIGS. 14, 15, and 16, where it is again understood that the figures are drawn to a scale which would not necessarily be used in practice, the scale being selected merely for permitting clear illustration of the several embodiments of the invention. For example, the device structure illustrated in FIG. 14 is generally similar to that of FIG. 7, but with the lead 10 of base 2 fixed to an intermediate and more heavily doped type $n+$ conductivity layer 2a interposed between the type $n$ base layer 2 and the type $p+$ emitter layer 3. Layer 2a may be formed by a conventional additional epitaxial or other fabrication step during construction of the device. In the instance of FIG. 14, the lead 10 is affixed to layer 2a for further improving the performance and flexibility of the device. The FIG. 14 configuration is advantageous, as it permits more sensitive control of the base current supplied via lead 10. Furthermore, if the n+ region 2a adjacent the junction is doped heavily enough, penetration of the depletion zone of collector 5 is difficult. The Early effect sensitivity of the threshold voltage $V_{th}$ is thereby advantageously reduced, making the point of switching of state less sensitive to the magnitude of the collector 5 bias voltage. In this manner, determination of the condition under which the depletion zone of collector 5 collapses is more completely controlled by the base 2 current. The FIG. 14 version of the invention is particularly valuable for high speed switching functions and for storage purposes.

In the structure of FIG. 15, the FIG. 14 arrangement is revised by inversion of the order of the respective n+ and n layers 2 and 2a, with the lead 10 being affixed to the type n+ layer 2. This arrangement has several particular benefits, providing a sensitive means for controlling the field across the non-linear resistance layer 1 as well as controlling the emitter layer 9 current. The FIG. 15 arrangement, like that of FIG. 14, is adaptable to performing switching and memory functions.

Like the device of FIG. 14, though to a somewhat lesser extent, the configuration of FIG. 15 reduces the base circuit resistance as compared to that of FIG. 7. With the dopant level of the type n+ layer 2 in FIG. 15 sufficiently high, it is possible to prevent any possibility of switching to the low impedance state only by avalanche breakdown of the surface depletion zone. This results in a uniformly faster transition to the low impedance state, reducing the contribution of the Early effect in causing the transition, avalanche breakdown being less sensitive to temperature variations. If the type n+ layer 2 adjacent the non-linear resistor layer 1 is even more heavily doped, then Zener rather than avalanche breakdown is the mechanism responsible for the transition of state, Zener breakdown having a dependence on temperature opposite to that of avalanche breakdown. Furthermore, the level of dopant in layer 2 may be selected so that the breakdown of the surface depletion zone is caused by both avalanche and Zener breakdown; in this case, there is very little temperature dependence on breakdown. The novel configuration of FIG. 16 is generally analogous to that of FIG. 15, with the primary exception that the junction in FIG. 15 is replaced by supplying a Schottky barrier emitter interface between type n layer 53 and the metal barrier layer electrode 54.

The versatile controlled inversion devices of FIG. 7 and 14 through 16 all permit the use of variation in the threshold voltage $V_{th}$ for transition to the low impedance state, the parameter $V_{th}$ being defined as in the aforegoing as that critical voltage measured either with respect to the emitter or base electrode, beyond which a low collector current is impossible to maintain. Variation in $V_{th}$ can be achieved by changing the base electrode current, accomplished in practice by changing the emitter junction voltage bias, such as by control of the conventional variable source 23 of FIG. 7. In this manner, minority carrier transport across the base region is possible.

The variation in $V_{th}$ with changing base current may be understood by those skilled in the art by reference to the foregoing discussion of FIGS. 1 through 6 concerning the dynamic equilibrium that exists when any of the novel devices of FIGS. 7 and 14 through 16 is biased near $V_{th}$. The emitter electrode current will be proportional to the factor $p(0)/W_B$, where $p(0)$ is the hole concentration at the edge of the junction's depletion zone, and $W_B$ is the base width factor (the distance between the junction and surface depletion zones or the dimension of the neutral base region). The transition to a collapsed surface depletion zone with surface inversion occurs when the insulator layer current cannot keep pace. Increasing the base current forces an increase in $p(0)$ and therefore increases the collector current, in turn making it more difficult for the incipient inversion layer to be discharged through the non-linear resistor. This is the novel mechanism by which the third terminal 10 of FIGS. 7 and 14 through 16 may be used to control $V_{th}$. Employing it, the novel devices may be triggered to the collapsed surface depletion zone state (or high collector electrode current state) by either increasing the collector voltage or by increasing the base current. Alternatively, the novel mechanism is useful in inhibiting any transition to the low collector impedance state by simultaneously decreasing base current when an increasing collector voltage is applied, or by decreasing the collector voltage when an increasing base current is applied.

While the forms of the invention thus far described have wide application in discrete and integrated semiconductor circuits, preferred forms of the invention permit electrical connections to be made to only two of the surfaces of the novel element, rather than to three, a configuration which is clearly advantageous especially in large scale integrated circuits including semiconductor storage circuits for digital computers and the like. This further preferred form of the invention is illustrated in FIGS. 17, 18 and 19 and it will be understood that it may readily be used, for example, in the circuits and applications discussed in connection with FIGS. 7 through 16.

Figure 17:
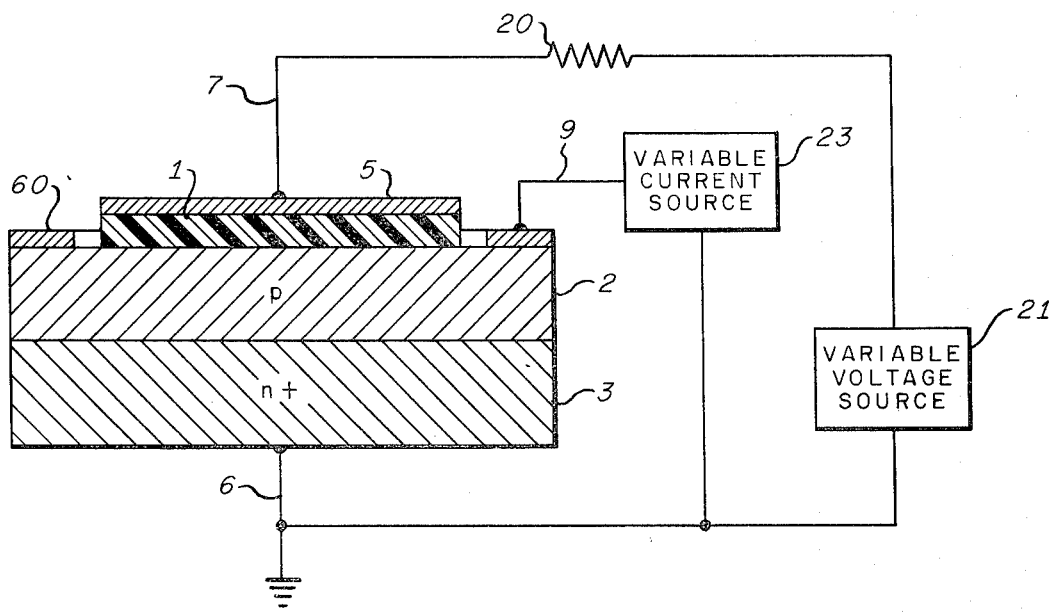

In the form of the invention found in FIG. 17, the semiconductor may be formed by epitaxial deposition of a type p conductivity layer 2 on a type n+ layer 3 (layer 2 may have n conductivity and layer 3 p+ conductivity). The non-linear resistive layer 1 and metal layer 5 are formed as before, layer 5 being molybdenum, for example, and serving as the collector electrode for the device, while the ohmic connection 6 serves as an emitter. The base electrode is no longer attached as it was, for instance, in FIG. 7, but takes the form of a metal ring 60 disposed on the upper surface of layer 2 in generally concentric relation about collector 5 and the non-linear resistive layer 1. As a matter of illustration only, FIG. 17 shows that the novel epitaxially grown junction device may also be connected in operating circuit relation with respective sources 21 and 23 of variable voltage and current, which may supply continuous or pulsed signals.

Figure 18:
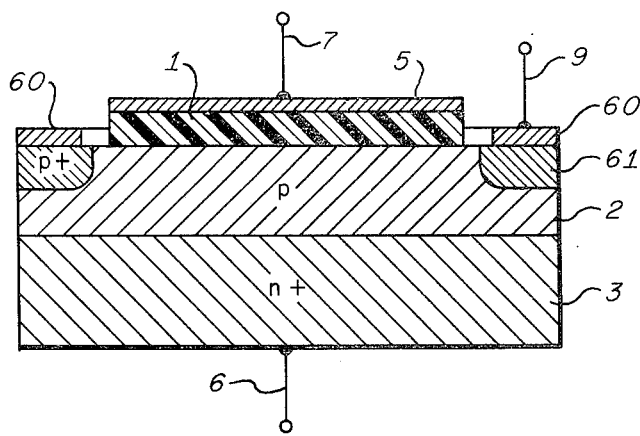

The novel structure of FIG. 18 is constructed in a similar manner except that an improved annular base contact 60 is provided. The epitaxial layers 2 and 3 again form the active junction interface and the non-linear resistive layer 1 and collector electrode 60 may operate as in FIG. 17. In FIG. 18, use is made of conventional oxide mask-controlled diffusion into layer 2 to form a type p+ annulus 61 before annular electrode 60 is formed. The annular diffused region 61 cooperates with electrode 60 reliably to provide advantageously low base resistance, thereby permitting flow of large currents upon switching.

Figure 19:
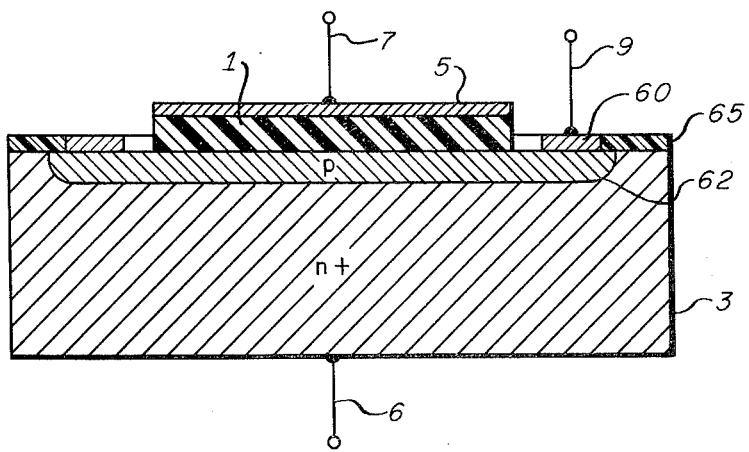

In FIG. 19, the active p-$n^+$ junction is formed in the type $n^+$ semiconductor layer 3 by conventional diffusion methods, rather than by epitaxial growth. The type p diffused region 62 is formed by a standard planar process, such as by conventional oxide masking using photolithographic techniques to define the diffusion window. Following the diffusion process, the base ring 60 and the collector layers 1 and 5 are added, as before. Finally, silica layer 65 is provided.

Accordingly, it is seen that the invention has stable characteristics making it particularly applicable to use in data storage devices such as large scale integrated circuit semiconductor memories. Rapidly and reliably switchable between two stable states, it lends itself to use in integrated circuits in which all fabrication steps would be taken at relatively low temperatures, assuring reliability of the product. With very high switching speeds and with inherent memory and logic function capability, the invention may be conveniently fabricated in the form of high speed, high packing density memory arrays and the like.

While semiconductor junctions have generally been discussed in the foregoing material as minority carrier generators, it will be understood that other such active devices may be substituted for such junctions, including barrier emitter elements. It will be understood that the dimensions and proportions used in the several figures are used with a view of presenting the invention with clarity and are not necessarily the dimensions or proportions which would be used in constructing the device of the invention for a particular application. Further, the phrases non-linear materials, non-linear resistive materials, and the like are intended to refer to a general class of materials of which pyrolytically or otherwise deposited silicon nitride and silcon oxynitride are examples. These materials are among those that exhibit conduction at high applied electric fields, and very little or no conduction at relatively low applied electric fields. They may also present significant non-linearity of conduction under different electric field gradients with respect to a threshold voltage which demarks low and high impedance states.

While the invention has been described in its preferred embodiments, it is to be understood that the words which have been used are words of description rather than of limitation and that changes within the purview of the appended claims may be made without departing from the true scope and spirit of the invention in its broader aspects.

We claim:
1. Controlled inversion semiconductor circuit means comprising:
   semiconductor body means having first and second spaced surface means,
   non-linear resistive layer means affixed to said first surface means,
   conductive layer means affixed to said non-linear resistive layer means opposite said semiconductor body means,
   first electrical signal source means for applying a first control signal between said conductive layer means and said second surface means,
   minority carrier generator means within said semiconductor body means for generating an inversion layer within said semiconductor body means at said non-linear resistive layer means when said first control voltage reaches a predetermined threshold value,
   said non-linear resistive layer means tending to prevent formation of said inversion layer when said first control signal remains below said predetermined threshold value,
   second electrical signal source means for applying a second control signal between said second surface means and ohmic contact means disposed on said semiconductor body means between said minority carrier generator means and said non-linear resistive layer means for further controlling the supply of minority carriers reaching said inversion layer, and
   utilization means in series relation with said first electrical signal source means and said conductive layer means.

2. Apparatus as described in claim 1 wherein said ohmic contact means is disposed on said semiconductor body means between said minority carrier generator means and said first surface means.

3. Apparatus as described in claim 1 where said semiconductor body means comprises first and second semiconductor layer means of respective first and second semiconductor conductivity types for forming semiconductor junction minority carrier generator means therebetween.

4. Apparatus as described in claim 3 wherein said ohmic contact means is conductively coupled to said first semiconductor layer means.

5. Apparatus as described in claim 3 wherein said ohmic contact means is conductively coupled to said first semiconductor layer means between said semiconductor junction generator means and said first surface means.

6. Apparatus as described in claim 1 wherein said semiconductor body means comprises silicon.

7. Apparatus as described in claim 6 wherein said non-linear resistive layer means comprises a pyrolytically deposited nitride of silicon.

8. Apparatus as described in claim 1 wherein said minority carrier generator means provides means for generating a substantial inversion layer at said non-linear resistive layer means in a first state of resistivity thereof and substantially no inversion layer at said non-linear resistive layer means in a second state of resistivity thereof.

9. Apparatus as described in claim 1 wherein the signal amplitude of said second control signal is adjustable for selectively producing amplified current flow into said utilization means.

10. Apparatus as described in claim 1 wherein at least one of said first and second electrical signal source means is a source of pulsed electric signals.

11. Apparatus as described in claim 1 wherein said first and second electrical signal source means provide respective first and second pulsed electrical signals of first and second predetermined amplitudes whereby an amplitude current pulse flows into said utilization means upon substantial time overlap of a said first and a said second pulsed electrical signal.

12. Apparatus as described in claim 1 wherein said first and second electrical signal source means provide respective first and second control signals of first and second predetermined amplitudes whereby current flow is initiated into said utilization means upon substantial time overlap of said first and second control signals and continues even after said second control signal has ended only when said second control signal exceeds a predetermined amplitude.

13. Apparatus as described in claim 3 wherein said second electrical signal source means comprises variable impedance means coupled directly between said second surface means and ohmic contact means on said first semiconductor layer means for effecting synchronous application of said first and second control signals.

14. Apparatus as described in claim 3 wherein said second electrical signal source means comprises controlled inversion semiconductor means having first terminal means coupled to said second surface means, second terminal means coupled to ohmic contact means disposed on said first semiconductor layer means, and third terminal means coupled to third electrical signal source means.

15. Apparatus as described in claim 1 additionally including means for selectively illuminating said semiconductor body means in the presence of at least said first control signal current flow in said utilization means indicating the presence of illumination thereof above a predetermined light level.

16. Apparatus as described in claim 3 wherein one of said respective first and second conductivity types is type *p* while the other is type *n*.

17. Apparatus as described in claim 3 additionally including third semiconductor layer means interposed between said second semiconductor conductivity layer means and said non-linear resistive layer means.

18. Apparatus as described in claim 1 wherein said minority carrier generator means comprises metal barrier emitter means at said second surface.

19. Apparatus as described in claim 1 wherein said ohmic contact means is affixed to said semiconductor body means at said first surface means.

20. Apparatus as described in claim 19 wherein said ohmic contact means comprises ring-shaped annular metal electrode means.

21. Apparatus as described in claim 20 wherein said ohmic contact means is affixed on said first surface means in substantially concentric relation with respect to said non-linear resistive layer means.

22. Apparatus as described in claim 20 wherein said first semiconductor layer means is formed by epitaxial deposition upon said second semiconductor layer means.

23. Apparatus as described in claim 20 wherein said first semiconductor layer means is formed by diffusion of material within said semiconductor body means at said first surface means.

24. Apparatus as described in claim 3 wherein said first semiconductor layer means includes an annular region of third conductivity type at said first surface means, said ohmic contact means being disposed on said annular region of third conductivity type.

* * * * *